(12) United States Patent
St. Clair et al.

(10) Patent No.: US 7,241,540 B2
(45) Date of Patent: Jul. 10, 2007

(54) PHOTOCURABLE COMPOSITIONS AND FLEXOGRAPHIC PRINTING PLATES COMPRISING THE SAME

(75) Inventors: David J. St. Clair, Houston, TX (US); David R. Hansen, Houston, TX (US); Donn A. Dubois, Houston, TX (US)

(73) Assignee: Kraton Polymers U.S. LLC, Houston, TX (US)

( * ) Notice: Subject to any disclaimer, the term of this patent is extended or adjusted under 35 U.S.C. 154(b) by 238 days.

(21) Appl. No.: 10/832,733

(22) Filed: Apr. 27, 2004

(65) Prior Publication Data

US 2005/0239930 A1    Oct. 27, 2005

(51) Int. Cl.
  *G03F 7/033*    (2006.01)
(52) U.S. Cl. .................. 430/18; 430/286.1; 430/287.1; 430/306; 430/285.1; 430/281.1
(58) Field of Classification Search ...................... None
  See application file for complete search history.

(56) References Cited

U.S. PATENT DOCUMENTS

| | | | |
|---|---|---|---|
| 3,244,664 A | 4/1966 | Zelinski et al. | |
| 3,281,383 A | 10/1966 | Zelinski et al. | |
| 3,494,942 A | 2/1970 | Miki et al. | |
| RE27,145 E | 6/1971 | Jones | |
| 3,594,452 A | 7/1971 | De La Mare et al. | |
| 3,634,549 A | 1/1972 | Shaw et al. | |
| 3,670,054 A | 6/1972 | De La Mare et al. | |
| 3,692,874 A | 9/1972 | Farrar et al. | |
| 3,700,633 A | 10/1972 | Wald et al. | |
| 3,766,301 A | 10/1973 | De La Mare et al. | |
| 3,880,954 A | 4/1975 | Kahle et al. | |
| 3,985,830 A | 10/1976 | Fetters et al. | |
| 4,076,915 A | 2/1978 | Trepka | |
| 4,104,332 A | 8/1978 | Zelinski | |
| 4,126,466 A | 11/1978 | Roos | |
| 4,185,042 A | 1/1980 | Verkouw | |
| 4,234,676 A | 11/1980 | Hein et al. | |
| 4,266,005 A | 5/1981 | Nakamura et al. | |
| 4,320,188 A | 3/1982 | Heinz et al. | |
| 4,323,636 A | 4/1982 | Chen | |
| 4,323,637 A * | 4/1982 | Chen et al. ............... 430/288.1 |
| 4,369,246 A * | 1/1983 | Chen et al. ............... 430/306 |
| 4,379,891 A | 4/1983 | Haynes | |
| 4,427,759 A | 1/1984 | Gruetzmacher et al. | |
| 4,430,417 A | 2/1984 | Heinz et al. | |
| 4,460,675 A | 7/1984 | Gruetzmacher et al. | |
| 4,622,088 A * | 11/1986 | Min ......................... 430/281.1 |
| 4,879,349 A | 11/1989 | Hoxmeier | |
| 4,894,315 A | 1/1990 | Feinberg et al. | |
| 4,940,650 A | 7/1990 | Kurtz et al. | |
| 5,001,199 A | 3/1991 | Hoxmeier | |
| 5,075,377 A | 12/1991 | Kawabuchi et al. | |
| 5,149,895 A | 9/1992 | Coolbaugh et al. | |
| 5,187,236 A | 2/1993 | Coolbaugh et al. | |
| 5,210,359 A | 5/1993 | Coolbaugh et al. | |
| 5,213,948 A | 5/1993 | Abele | |
| 5,242,986 A | 9/1993 | Gibler et al. | |
| 5,268,427 A | 12/1993 | Coolbaugh et al. | |
| 5,272,214 A | 12/1993 | Custro et al. | |
| 5,276,100 A | 1/1994 | Coolbaugh et al. | |
| 5,288,937 A | 2/1994 | Coolbaugh et al. | |
| 5,292,820 A | 3/1994 | Coolbaugh et al. | |
| 5,306,780 A | 4/1994 | Coolbaugh et al. | |
| 5,352,743 A | 10/1994 | Coolbaugh et al. | |
| 5,359,009 A | 10/1994 | Coolbaugh et al. | |
| 5,376,722 A | 12/1994 | Coolbaugh et al. | |
| 5,387,730 A | 2/1995 | Coolbaugh et al. | |
| 5,393,841 A | 2/1995 | Himes et al. | |
| 5,399,629 A | 3/1995 | Coolbaugh et al. | |
| 5,416,163 A | 5/1995 | Coolbaugh et al. | |
| 5,457,161 A | 10/1995 | Coolbaugh et al. | |
| 5,470,914 A | 11/1995 | Coolbaugh et al. | |
| 5,472,824 A | 12/1995 | Schober et al. | |
| 5,496,684 A | 3/1996 | Farber et al. | |
| 5,510,548 A | 4/1996 | Coolbaugh et al. | |
| 5,530,068 A | 6/1996 | Coolbaugh et al. | |
| 5,545,783 A | 8/1996 | Coolbaugh et al. | |
| 5,569,718 A | 10/1996 | Coolbaugh et al. | |
| 5,625,100 A | 4/1997 | Coolbaugh et al. | |
| 5,639,831 A | 6/1997 | Himes et al. | |
| 5,663,239 A | 9/1997 | Coolbaugh et al. | |
| 5,681,895 A | 10/1997 | Bening et al. | |
| 5,693,718 A | 12/1997 | De Groot et al. | |
| 5,717,035 A | 2/1998 | Coolbaugh et al. | |

(Continued)

FOREIGN PATENT DOCUMENTS

EP    0 696 761 A1    2/1996

(Continued)

OTHER PUBLICATIONS

English abstract and Machine translation of JP -10-073921-A, from Patent Abstracts of Japan, pp. 2of 2 and 1 of 1 and 8 of 8.Obtained fromhttp://www.ipdl.ncipi.go.jp/homepg_e.ipdl.*

*Primary Examiner*—Cynthia Hamilton
(74) *Attorney, Agent, or Firm*—Michael A. Masse

(57) ABSTRACT

The present invention relates to photocurable compositions for use in flexographic printing plates comprising selectively hydrogenated block copolymers of conjugated dienes and monoalkenyl arenes and flexographic printing plates made from the same. The block copolymers, either linear or radial, have terminal blocks of unsaturated conjugated diene. The block copolymer is further comprised of monoalkenyl arene blocks and hydrogenated conjugated diene blocks. The compositions exhibit exceptional improvement in degree of cure over comparative selectively hydrogenated block copolymers.

13 Claims, No Drawings

U.S. PATENT DOCUMENTS

| | | |
|---|---|---|
| B3,985,830 I5 | 3/1998 | Fetters et al. |
| 5,795,944 A | 8/1998 | Graafland et al. |
| 5,798,202 A | 8/1998 | Cushner et al. |
| 5,804,353 A | 9/1998 | Cushner et al. |
| 6,171,758 B1 | 1/2001 | Bhateja et al. |
| 6,184,307 B1 | 2/2001 | Schisla |
| 6,326,127 B1 | 12/2001 | Morren et al. |
| 6,506,541 B2 | 1/2003 | Sugiyama et al. |
| 6,531,263 B2 | 3/2003 | Knoll |
| 2003/0225209 A1 | 12/2003 | Handlin, Jr. et al. |
| 2003/0225210 A1 | 12/2003 | Handlin, Jr. et al. |
| 2003/0232928 A1 | 12/2003 | Atwood et al. |

FOREIGN PATENT DOCUMENTS

| | | |
|---|---|---|
| EP | 0 696 761 B1 | 4/1998 |
| JP | 10-073921 A * | 3/1998 |
| WO | 01/26620 A1 | 4/2001 |
| WO | WO 01/68769 A1 | 9/2001 |
| WO | WO 01/90818 A1 | 11/2001 |

* cited by examiner

PHOTOCURABLE COMPOSITIONS AND FLEXOGRAPHIC PRINTING PLATES COMPRISING THE SAME

BACKGROUND OF THE INVENTION

1. Field of the Invention

The present invention relates to photocurable compositions, to flexographic printing plates derived from said compositions and to flexographic printing relief forms prepared from said plates. More in particular, the present invention relates to compositions showing an improved combination of curability and ozone resistance.

2. Background

Photocurable printing plates are known for use in making flexographic printing forms. The printing surface is produced by exposing a photocurable layer image-wise to actinic radiation and subsequently removing the unexposed, non-photocured areas of the printing plate. Examples are found in the following patents: DE C-2215090, U.S. Pat. No. 4,266,005, U.S. Pat. No. 4,320,188, U.S. Pat. No. 4,126,466, U.S. Pat. No. 4,430,417, U.S. Pat. No. 4,460,675 and U.S. Pat. No. 5,213,948.

Such photocurable printing plates usually comprise a support, an optional adhesive layer or other underlayer, one or more photocurable layers, an optional elastomeric intermediate layer and a cover layer. A preferred method for making such multilayer photocurable printing plates is by a process in which a previously extruded photocurable composition is fed into the nip of a calendar and is calendered between a support layer and a cover layer, thus forming a photocurable layer between them. EP B-0084851 disclosed a preparation method for a multilayer photocurable printing plate, having an added elastomeric layer between the cover layer and the photocurable layer.

The photocurable layers contain polymeric binders, photocurable monomers, photo-initiators, and added auxiliaries such as plasticizers, fillers, stabilizers etc. The polymeric binders are usually thermoplastic elastomeric block copolymers, as disclosed in e.g. U.S. Pat. No. 6,531,263 and DE-C-2,215,090. These are generally block copolymers of the general formulae A-B-A or $(AB)_n$ or $(AB)_nX$, comprising thermoplastic blocks A and elastomeric blocks B, particularly linear and radial block copolymers with poly (monovinyl aromatic hydrocarbon) end blocks.

Unhydrogenated styrene diene block copolymers, both the SIS and SBS types, can be used to make UV cured, flexographic printing plates as taught in U.S. Pat. No. 4,427,759. Although they are widely used and give excellent performance, one limitation is that the plates made with the unsaturated polymers have limited resistance to degradation by ozone. This is becoming more of a problem as UV cured inks become more widely used since ozone is generated from oxygen during the UV irradiation used to cure the ink.

Now an improved photocurable composition based on selectively hydrogenated block copolymers having both hydrogenated conjugated diene blocks and unsaturated conjugated diene blocks has been found. This improved composition leads to high gel contents, or degree of cure, after photocure. The higher gel content is expected to result in improved resolution and dimensional stability of the flexographic printing plate. Furthermore, the selectively hydrogenated character of the block copolymer comprising the photocurable composition is expected to be resistant to ozone generated during photocure of the flexographic plate itself and of UV curable inks.

SUMMARY OF THE INVENTION

In one aspect the invention is a photocurable composition comprising: a) from 80 to 90% by weight of a selectively hydrogenated block copolymer having at least one hydrogenated polybutadiene block (EB), at least two polymeric monovinyl aromatic hydrocarbon blocks (S), and at least one polymeric conjugated diene block (I) wherein the I block is a terminal block and is attached to an S block; from 5 to 15% by weight of an acrylic crosslinker; from 0 to 10% by weight of a softening oil; and from 0.5 to 4% by weight of a photoinitiator.

In another aspect the invention is a flexographic printing plate made by photo-curing the photo-curable compositions.

DETAILED DESCRIPTION OF THE INVENTION

The present invention comprises a block copolymer as component (a). As used herein the block copolymer is defined as having at least two blocks of a mono alkenyl arene (S), such as styrene, and at least one block of a substantially hydrogenated conjugated diene (EB) and at least one block of a substantially unsaturated conjugated diene (I).

The block copolymers are prepared using living anionic polymerization techniques commonly known. These techniques generally employ alkali metal initiatiors such as organo-lithium compounds. The monomers composing the conjugated diene and monoalkenyl arene blocks can be selected from the general class of anionically polymerizable monomers. In particular, the conjugated diene monomers for use herein are 1,3-butadiene, commonly referred to as butadiene, and substituted butadiene such as isoprene, piperylene, 2,3-dimethyl-1,3-butadiene, and 1-phenyl-1,3-butadiene, or mixtures thereof. Most preferred in the present invention are butadiene and isoprene. The monovinyl arene monomers for use herein are styrene, alpha-methyl styrene, para-methyl styrene, vinyl toluene, vinylnaphthalene and para-butyl styrene. In the present invention the most preferred monovinyl arene monomer is styrene The embodiments of the present invention comprise a block copolymer composition which is a linear tetrablock, a linear pentablock, a linear multiblock, a symmetrical radial, an asymmetrical radial block copolymer, or mixtures thereof. In all cases there is at least one terminal substantially unsaturated conjugated diene block (I). The I block is attached at only one of its ends and it is attached to an S block. Furthermore, the S blocks are separated by an EB block.

The structure of the linear block copolymers of the present invention is generally represented I-(S-EB)$_g$-S—I$_h$ where g is from 1 to 20 and h is 0 or 1. Linear tetrablock copolymers result when g is 1 and h is 0 and have the structure I—S-EB-S. Likewise, linear pentablock copolymers result when g is 1 and h is 1 and have the structure I—S-EB-S—I. The block copolymer of the present invention can be a pure tetrablock, pentablock or multiblock copolymer or mixtures thereof.

The structure of the symmetric radial block copolymers of the present invention is generally represented (I—S-EB)$_p$Y where Y is the residue of a coupling agent and p is 2 to 4. The skilled practitioner will recognize that when p is 2 a linear pentablock copolymer results.

The structure of the asymmetric radial block copolymers of the present invention is generally represented (I—S-EB)$_q$ Y(EB-S)$_r$ where q, on average, is at least 1 and (q+r) is 2 to 4. The skilled practitioner will recognize that when (q+r) is 2 then a linear tetrablock copolymer results.

The method to prepare this block copolymer is via the methods generally known for block copolymer polymerizations. Methods involving living anionic polymerization are preferred. Specifically, the linear block copolymers can be prepared by sequential polymerization wherein the appropriate monomer is added and fully polymerized to form each block in a sequential fashion until the desired structure is obtained.

Mixtures of the linear block copolymers of the present invention may be prepared by blending two or more block copolymers of different structure or by reinitiation polymerization. The use of reinitiation polymerization to prepare mixtures of block copolymer structures has been taught in U.S. Pat. No. 5,693,718 which is incorporated by reference. In the reinitiation polymerization method, a portion of anionic initiator is added subsequent to the initial initiator addition to begin the in-situ polymerization of a structure similar but truncated in some regard. In the present invention the truncation specifically relates to the absence of an I block.

Symmetrical radial block copolymers of the present invention are made by sequential polymerization of living block copolymer arms followed by coupling into the radial structure. The skilled practitioner will recognize that radial structures having two arms are linear. They are radial in the sense that the arms radiate from the coupling site.

Asymmetric radial block copolymers of the present invention can be made by coupling a mixture of living block copolymer arms of different structure. Alternately, the asymmetric radial block copolymers can be made by a reinitiation process during preparation of the living arms followed by coupling. Importantly, the asymmetric radial block copolymers must have on average one I block per molecule.

Because of viscosity limitations during formulation of the photocurable composition, application of the composition as a flexographic printing plate before curing, and washing during development of the cured flexographic printing plate, linear block copolymers are most preferred.

It is important to control the molecular weight of the various blocks. Each terminal conjugated diene block I has a molecular weight from 5,000 to 50,000. The more preferred I block molecular weight is from 7,500 to 40,000 and the most preferred is from 10,000 to 30,000. Each monoalkenyl arene block S has a molecular weight from 3,000 to 30,000. The more preferred S block molecular weight is from 4,000 to 25,000 and the most preferred is from 5,000 to 20,000. The substantially hydrogenated EB block has a molecular weight from 10,000 to 60,000. The more preferred EB block molecular weight is from 12,500 to 50,000 and the most preferred is from 15,000 to 40,000.

It will be understood that during coupling, the coupling site is at the termini of the EB segments. The coupling process produces the final EB block by joining two or more living arms, each having EB segments. As such, the EB molecular weights herein specified refer to the hydrogenated conjugated diene molecular weight between two monoalkenyl arene S blocks. Regardless of whether the coupled polymer results from the coupling of two living arms (linear block copolymer) or more living arms, the molecular weight of the conjugated diene segments in the living arms before coupling will be half the EB molecular weight herein specified.

Coupling agents having two reactive sites are used herein to form linear, coupled polymers. For example, one coupling agent employed in making linear polymers is methyl benzoate as disclosed in U.S. Pat. No. 3,766,301. Radial polymers are formed by employing coupling agents having two or more reactive sites. Examples of such coupling agents include among others silica compounds, including silicon tetrachloride and alkoxy silanes as taught in U.S. Pat. Nos. 3,244,664, 3,692,874, 4,076,915, 5,075,377, 5,272,214 and 5,681,895; polyepoxides, polyisocyanates, polyimines, polyaldehydes, polyketones, polyanhydrides, polyesters, polyhalides as taught in U.S. Pat. No. 3,281,383; diesters as taught in U.S. Pat. No. 3,594,452; alkoxy silanes as taught in U.S. Pat. No. 3,880,954 and published U.S. Patent Application 2003/0232928 A1; divinyl benzene as taught in U.S. Pat. No. 3,985,830; 1,3,5-benzenetricarboxylic acid trichloride as taught in U.S. Pat. No. 4,104,332; glycidoxytrimethoxy silanes as taught in U.S. Pat. No. 4,185,042; and oxydipropylbis(trimethoxy silane) as taught in U.S. Pat. No. 4,379,891.

The effectiveness of the coupling reaction is referred to as coupling efficiency. The coupling efficiency is expressed normally and herein as the percentage of living anionic polymeric arms that are incorporated into a coupled structure having at least two arms basis the total number of arms prior to coupling. Coupling efficiencies in the range of 1% to 100% are of interest in the present invention. The more preferred coupling efficiency is greater than 20% and most preferred is greater than 40%.

Another important aspect of the present invention is to control the microstructure or vinyl content of the substantially hydrogenated conjugated diene block. The term "vinyl content" refers to a conjugated diene, which is polymerized via 1,2-addition (in the case of butadiene—it would be 3,4-addition in the case of isoprene). Although a pure "vinyl" group is formed only in the case of 1,2-addition polymerization of 1,3-butadiene, the effects of 3,4-addition polymerization of isoprene (and similar addition for other conjugated dienes) on the final properties of the block copolymer will be similar. The term "vinyl" refers to the presence of a pendant vinyl group on the polymer chain. When referring to the use of butadiene as the conjugated diene, it is preferred that about 20 to about 90 mol percent of the condensed butadiene units in the copolymer block have 1,2 vinyl configuration as determined by H-1 NMR analysis, preferably about 35 to 80 mol percent of the condensed butadiene units should have 1,2-vinyl configuration. This is effectively controlled by varying the relative amount and/or type of the distribution agent. Suitable types and ratios of distribution agent to lithium polymerization initiator are disclosed and taught in U.S. Pat. No. Re. 27,145 and 5,795,944, which disclosures are incorporated by reference.

The block copolymer is selectively hydrogenated. Hydrogenation can be carried out via any of the several hydrogenation or selective hydrogenation processes known in the prior art. For example, such hydrogenation has been accomplished using methods such as those taught in, for example, U.S. Pat. Nos. 3,494,942; 3,634,549; 3,670,054; 3,700,633; and U.S. Pat. No. Re. 27,145. Hydrogenation can be carried out under such conditions that at least about 90 percent of the conjugated diene double bonds in the EB block have been reduced, and between zero and 10 percent of the arene double bonds have been reduced. Preferred ranges are at least about 95 percent of the EB block double bonds reduced, and more preferably about 98 percent of the conjugated diene double bonds are reduced. Importantly, the hydrogenation is conducted in such a fashion to substantially hydrogenate the EB block while leaving the I block substantially unhydrogenated. Substantially hydrogenated means less than 10 mol % of the double bonds remain unsaturated. Substantially unhydrogenated means at least 50 mol % and most preferably 50 to 90 mol % of the original double bonds remain unsaturated.

In order to achieve the selective hydrogenation of the present invention the EB and I blocks are composed of different conjugated dienes. The conjugated diene of the EB block will become saturated faster and more completely than the conjugated diene of the I block with the catalyst and process conditions employed for hydrogenation. 1,3-butadiene, referred to as butadiene hereafter, is the preferred conjugated diene for the EB block. Isoprene is the preferred conjugated diene for the I block.

The preferred amount of block copolymer component (a) is from 60 to 98% by weight basis the total amount of components (a), (b), (c), and (d). The more preferred amount of component (a) is from 70 to 95% by weight and the most preferred amount is from 80 to 90% by weight.

The photo-curable compositions of the present invention comprise as component (b) acrylic crosslinking compounds selected from monounsaturated or polyunsaturated monomers, such as e.g. esters or amides of acrylic acid or methacrylic acid with monofunctional or polyfunctional alcohols, amines, aminoalcohols and hydroxyethers or hydroxyesters. Also suitable are mixtures of monounsaturated and polyunsaturated compounds, as described in DE-C 3744243 and DE-A-3630474. More specific examples of addition polymerizable compounds are butyl acrylate; isodecyl acrylate; 1,6-hexanediol dimethacrylate; 1,6-hexanediol diacrylate (HDDA); trimethylolpropane triacrylate and dipentaerythritol monohydroxypentacrylate. The preferred acrylic crosslinkers are 1,6-hexanediol diacrylate, 1,6-hexanediol dimethacrylate, and trimethylolpropane triacrylate.

The preferred amount of component (b) is from 2 to 50% by weight basis the total weight of components (a), (b), (c) and (d). The more preferred amount of component (b) is from 3 to 30% by weight and the most preferred amount is from 5 to 15% by weight.

The photo-curable compositions optionally comprise a softening oil as component (c). Especially preferred are the types of oils that are compatible with the elastomeric segment of the block copolymer. While oils of higher aromatics content are satisfactory, those petroleum-based white oils having low volatility and less than 50% aromatic content are preferred. Such oils include both paraffinic and naphthenic oils. The oils should additionally have low volatility, preferably having an initial boiling point above about 500° F. An example of a paraffinic oil is Drakeol 34 available from Penreco. An example of a naphthenic oil is Shellflex 371 available from Shell Chemical.

Examples of alternative plasticizers which may be used in the present invention are oligomers of randomly or sequentially polymerized styrene and conjugated diene, oligomers of conjugated diene, such as butadiene or isoprene, liquid polybutene-1, and ethylene-propylene-diene rubber, all having a weight average molecular weight in the range from 300 to 35,000, preferable less than about 25,000 molecular weight.

The preferred amount of softening oil component (c) is less than 25% by weight basis the total weight of components (a), (b), (c) and (d). The more preferred amount is less than 15% by weight and the most preferred amount is from 0 to 10% by weight.

The photo-curable compositions also comprise a photo-initiator or a photoinitiator system as component (d). Examples of suitable photo-initiators have been disclosed in European Patent Specification 0 696 761 and U.S. Pat. Nos. 4,894,315; 4,460,675 and 4,234,676 incorporated herein by reference. Typically, the photo-initiator is selected from optionally substituted polynuclear quinones, aromatic ketones, benzoin and benzoin ethers and 2,4,5-triarylimidazolyl dimers.

Preferred photo-initiators are selected from the group consisting of:

(1) a benzophenone of the general formula (I)

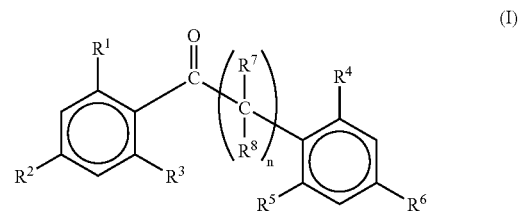

wherein $R^1$ to $R^6$ independently represent hydrogen or an alkyl group having from 1 to 4 carbon atoms, preferably methyl, and wherein $R^7$ and/or $R^8$ have the same meaning as $R^1$ to $R^6$ or represent an alkoxy group of 1 to 4 carbon atoms and wherein n has a value of 0, 1, or 2, optionally in combination with at least one tertiary amine, (2) a sulphur-containing carbonyl compound, wherein the carbonyl group is directly bound to at least one aromatic ring and is preferably of the general formula II

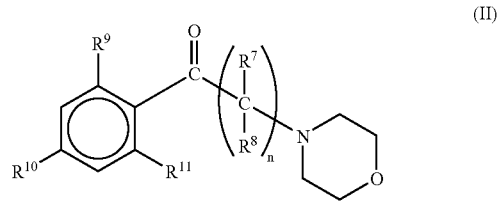

wherein $R^9$, $R^{10}$, and $R^{11}$ each may represent hydrogen, alkyl of 1 to 4 carbon atoms, or an alkylthio having 1 to 4 carbon atoms, and (3) mixtures of (1) and (2).

Examples of suitable compounds of category (1) are benzophenone, 2,4,6-trimethylbenzophenone, 4-methylbenzophenone and an eutactic mixture of 2,4,6-trimethylbenzophenone and 4-methylbenzophenone (ESACURE TZT) and 2,2-dimethoxy-1,2-diphenylethan-1-one (IRGACURE 651) (ESACURE and IRGACURE are trade marks). These compound may be employed in combination with tertiary amines, such as e.g. UVECRYL 7100 (UVECRYL is a trade mark).

Category (2) embraces compounds such as e.g. 2-methyl-1-[4-(methylthio)phenyl]-2-morpholino-propanone-1, commercially available as IRGACURE 907 (IRGACURE is a trade mark).

An example of suitable mixtures (category (3)) is a mixture of 15% by weight of a mixture of 2-isopropylthioxanthone and 4-isopropylthioxanthone, and 85% by weight of a mixture of 2,4,6-trimethylbenzophenone and 4-methylbenzophenone. This mixture is commercially available under the trade name ESACURE X15.

In a preferred embodiment of the present invention, the photoinitiator is selected from the group consisting of (i)

benzophenone, (ii) a mixture of benzophenone and a tertiary amine containing a carbonyl group which is directly bonded to at least one aromatic ring, (iii) 2-methyl-1-[4-(methylthio) phenyl]-2-morpholino-propanone-1 (IRGACURE 907), (iv) 2,2-dimethoxy-1,2-diphenylethan-1-one (IRGACURE 651), of which (iii) and (iv) are most preferred.

The preferred amount of photoinitiator component (d) is from 0.1 to 10% by weight basis the total weight of components (a), (b), (c) and (d). The more preferred amount of component (c) is from 0.2 to 6% by weight and the most preferred amount is from 0.5 to 4% by weight.

Examples of auxiliary components include aromatic resins, additional compatible rubber, fillers, dyes and/or pigments, antioxidants (such as IRGANOX 1010), antiozonants, thermal polymerization inhibitors and liquid poly (isoprene), liquid poly(butadiene) and/or liquid S—B or S—I diblock copolymers.

It will be appreciated that the flexographic printing plates according to the present invention can additionally comprise a support layer, which may consist of sheets of various film-forming synthetic polymers. Polyester and polyester/polyamide sheets, optionally having an adhesive layer and/or antihalation layer, are preferred, and in particular polyethylene terephthalate sheets. Moreover said flexographic printing plates may also comprise a cover element, which is usually composed of a flexible cover film, optionally a flexible polymeric film and/or a layer of elastomeric composition. The flexible cover film has to be removed before irradiation. This removal can be facilitated by a fine sheet of release agent under the flexible cover.

The photo-curable compositions to be used according to the present invention can be prepared in a conventional manner by homogeneously mixing the individual components, for example in solution, or in a kneader, a mixer or an extruder. Said compositions have good processability and layers of the desired thickness can be produced from the composition by e.g. casting a solution in a suitable solvent, such as toluene, xylene, cyclohexane, cyclopentane, tetrahydrofuran, methyl isobutyl ketone or tetrachloro ethylene, on an appropriate base. Layers of the composition can also be produced by compression molding, extrusion or calendaring, and when a suitable process temperature, combined with a suitable inhibitor is used, no incipient thermal cross-linking will occur. The thickness of the layers can be varied within wide limits and can easily be chosen to suit a particular application. The thickness of the layers is usually in the range of from 0.01 to 6.5 mm.

The flexographic printing plate is exposed image-wise through a negative by commonly used methods. The cover layer of the flexographic printing plate is removed as usual before image-wise exposure. Any type and source of actinic radiation can be used to prepare the flexographic printing relief forms. Suitable radiation sources are, for example, mercury vapour lamps, ultraviolet light lamps, incandescent lamps with special phosphors that emit ultraviolet light, argon incandescent lamps, ultraviolet fluorescent lamps, and photo lamps.

An overall backside exposure can be made before or after image-wise exposure. This exposure can be diffuse or directional. The exposure source can be all of the radiation sources conventionally used for the image-wise exposure.

Unphoto-cured areas of the printing plate can be washed off with suitable developer solutions, such as, for example, aliphatic or aromatic hydrocarbons such as n-hexane, petroleum ether, hydrogenated petroleum fractions, limonene or other terpenes, toluene, isopropyl benzene etc., ketones such as, for example, methyl ethyl ketone, halogenated hydrocarbons such as chloroform, trichloroethane or tetrachloroethane, esters such as, for example, acetic esters, acetoacetic acid esters or mixtures of these solvents. Additives such as surfactants or alcohols are possible constituents. After being dried, the resulting printing forms can be post-exposed or post-treated chemically in any sequence to make a non-tacky printing surface.

The flexographic printing plates of the present invention have surprisingly been found to show improved gelation after photo-cure and are expected to have good ozone resistance and good transparency.

It will be appreciated that an important advantage of the flexographic printing plates of the present invention is, that they are transparent for visible and UV light, which enables a high quality sharpness in the subsequent flexographic printing plates.

EXAMPLES

The following examples are provided to illustrate the present invention. The examples are not intended to limit the scope of the present invention and they should not be so interpreted. Amounts are in weight parts or weight percentages unless otherwise indicated.

The polymer of the present examples and two comparative polymers are listed in Table 1. In the structural representations I is a polyisoprene block, EB is a hydrogenated polybutadiene block which has a vinyl content of about 40% before hydrogenation, and S is a polystyrene block.

TABLE 1

|  | Polymer A | Comparative 1 | Comparative 2 |
|---|---|---|---|
| Structure | $(I-S-EB)_2Y$ | $(S-EB)_2Y(I)_2$ | SIS |
| MW of I Block | 20,700 | 18,000 | 11,100 |
| MW of S Block | 11,500 | 10,000 | 96,500 |
| MW of EB Block | 25,300 | 21,000 | NA |
| Coupling Efficiency | 84 | 92 | NA |

Example 1

Photocurable compositions which contained no oil were made, photocured and tested. The components were added to toluene and mixed to achieve a 20% by weight solids solution. Samples were then cast from solution into containers formed from Mylar film (25 µm thickness), covered with opaque paper to limit exposure to light, and allowed to dry at ambient conditions for 3 weeks. The resulting photocurable composition film thicknesses were about 2.5 mm (0.1 inch). The films were cured using an ULTRAVIOLET PRODUCTS Model CL-1000 irradiation unit equipped with five 8 Watt bulbs (F8T5BL 8W Black Light). The exposure time on the open surface of the photocurable composition was 5 minutes. The films were then irradiated through the Mylar film backing for 10 minutes.

The photocured compositions were then removed from the Mylar film backing for testing. Hardness was tested according to ASTM D2240. Gel contents were measured on 2.5 cm (1 inch) disks which were cut from the photocured films. The disks were initially weighed and then immersed in toluene for four days to extract any uncured fraction. The swollen disks were then dried to remove toluene and then weighed. The gel content was calculated as the percentage of the original photocured composition which was insoluble in toluene. The formulations and results are presented in Table 2.

TABLE 2

| Composition, wt % | Formulation | | |
|---|---|---|---|
| | I | II | III |
| Polymer A | 87.8 | | |
| Comparative 1 | | 87.8 | |
| Comparative 2 | | | 87.8 |
| HDDA | 10.5 | 10.5 | 10.5 |
| IRGACURE 651 | 1.3 | 1.3 | 1.3 |
| IRGANOX 1010 | 0.4 | 0.4 | 0.4 |
| Properties | | | |
| Thickness, mm | 2.6 | 2.6 | 1.5 |
| Hardness, Shore A | 70 | 71 | 66 |
| Gel content, % | 95 | 71 | 96 |

The results presented in Table 2 show that high gel contents are achieved with inventive Polymer A. This gel content is significantly higher that that achieved with Comparative 1 at equivalent hardnesses. While similar gel contents and hardnesses are achieved with Comparative 2, this formulation will not have ozone resistance due to the lack of hydrogenated rubber blocks.

Example 2

Soft photocurable compositions including a softening oil were made and tested according to the procedures of Example 1. The formulations and test results are shown in Table 3.

TABLE 3

| Compostion, wt % | Formulation | |
|---|---|---|
| | I | II |
| Polymer A | 80.6 | |
| Comparative 1 | | 80.6 |
| HDDA | 8.1 | 8.1 |
| Shellflex 371 | 8.1 | 8.1 |
| IRGACURE 651 | 3.2 | 3.2 |
| Properties | | |
| Thickness, mm | 2.9 | 2.6 |
| Hardness, Shore A | 64 | 61 |
| Gel content, % | 86 | 50 |

The results presented in Table 3 show that the improvement in gel content of the inventive polymer is even more pronounced when the photocurable compositions comprise softening oils.

We claim:

1. A photocurable composition comprising:
   a. from 80 to 90% by weight of a selectively hydrogenated block copolymer having at least one hydrogenated poly(conjugated diene) block (EB), at least two polymeric monoalkenyl arene blocks (S), and at least one polymeric conjugated diene block (I) wherein the I block is a terminal block and is attached to an S block; and,
   b. from 5 to 15% by weight of an acrylic crosslinker; and
   c. from 0 to 10% by weight of a softening oil; and
   d. from 0.5 to 4% by weight of a photoinitiator
   wherein the block copolymer is a symmetric linear or radial polymer having the structure $(I-S-EB)_pY$ and Y is the residue of a coupling agent, and p is 2 to 4.

2. The photocurable composition of claim 1 wherein I is a polyisoprene block having a molecular weight from 10,000 to 30,000, EB is a hydrogenated polybutadiene block having a vinyl content from 35 to 80 mol % before hydrogenation and a molecular weight from 15,000 to 40,000, and S is a polystyrene block having a molecular weight from 5,000 to 20,000 and p is 2.

3. The photocurable composition of claim 1 wherein the acrylic crosslinker is selected from the group consisting of 1,6-hexanediol diacrylate, 1,6-hexanediol dimethacrylate, and trimethylolpropane triacrylate.

4. The photocurable composition of claim 1 wherein the softening oil is selected from group consisting of naphthenic mineral oil and paraffinic mineral oil.

5. The photocurable composition of claim 1 wherein the coupling agent is selected from the group consisting of dihaloalkanes, tri-alkoxysilanes, tetra-alkoxysilanes, gylcidyl diepoxides, and aliphatic diepoxides.

6. The photocurable composition of claim 5 wherein the coupling agent is tetraethoxy silane and n is 2.

7. The photocurable composition of claim 1 wherein the photoinitiator is selected from the group consisting of benzophenone, mixtures of benzophenone and tertiary amines, 2-methyl-1-[4-(methylthio)phenyl]-2-morpholinopropanone, and 2,2-dimethoxy-1,2-diphenylethan-1-one.

8. A flexographic printing plate made by the process of photocuring the photocurable composition of claim 1.

9. The flexographic printing plate of claim 8 wherein the process comprises irradiation by ultra-violet light.

10. The flexographic printing plate of claim 9 wherein the process comprises irradiation on the plate surface and through an ultra-violet transparent backing.

11. A photocurable composition comprising:
   a. from 80 to 90% by weight of a selectively hydrogenated block copolymer having at least one hydrogenated poly(conjugated diene) block (EB), at least two polymeric monoalkenyl arene blocks (S), and at least one polymeric conjugated diene block (I) wherein the I block is a terminal block and is attached to an S block; and,
   b. from 5 to 15% by weight of an acrylic crosslinker; and
   c. from 0 to 10% by weight of a softening oil; and
   d. from 0.5 to 4% by weight of a photoinitiator
   wherein the block copolymer is a linear tetrablock having the structure I—S-EB-S.

12. The photocurable composition of claim 11 wherein I is a polyisoprene block having a molecular weight from 10,000 to 30,000, EB is a hydrogenated polybutadiene block having a vinyl content from 35 to 80 mole percent before hydrogenation and a molecular weight from 15,000 to 40,000, and S is a polystyrene block having a molecular weight from 5,000 to 20,000.

13. A photocurable composition comprising:
   a. from 80 to 90% by weight of a selectively hydrogenated block copolymer having at least one hydrogenated poly(conjugated diene) block (EB), at least two polymeric monoalkenyl arene blocks (S), and at least one polymeric conjugated diene block (I) wherein the I block is a terminal block and is attached to an S block; and,
   b. from 5 to 15% by weight of an acrylic crosslinker; and
   c. from 0 to 10% by weight of a softening oil; and
   d. from 0.5 to 4% by weight of a photoinitiator
   wherein the block copolymer is an asymmetric radial block copolymer having a structure $(I-S-EB)_qY(EB-S)_r$ wherein, on average, q is at least 1 and (q+r) is 2 to 4.

* * * * *